(12) United States Patent
Tsuk et al.

(10) Patent No.: US 6,784,531 B2
(45) Date of Patent: Aug. 31, 2004

(54) POWER DISTRIBUTION PLANE LAYOUT FOR VLSI PACKAGES

(75) Inventors: Michael J. Tsuk, Arlington, MA (US); Colin E. Brench, Stow, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 176 days.

(21) Appl. No.: 10/170,613

(22) Filed: Jun. 13, 2002

(65) Prior Publication Data

US 2003/0230791 A1 Dec. 18, 2003

(51) Int. Cl.[7] ............................................. H01L 23/52
(52) U.S. Cl. ...................................... 257/691; 257/692
(58) Field of Search ................................ 257/691–692

(56) References Cited

U.S. PATENT DOCUMENTS 6,384,485 B1 * 5/2002 Matsushima ................ 257/778

* cited by examiner

*Primary Examiner*—Luan Thai

(57) ABSTRACT

A hexagonal conductor path layout for power and ground distribution planes in a multi-layer VLSI device. The invention reduces crosstalk between switching devices in signal nets by reducing impedance in the distribution planes. Impedance is reduced by providing more direct line current paths and providing maximum path change angles of less than ninety degrees. Reduced impedance causes reduced coupling between current flows which share a common path and hence less crosstalk.

10 Claims, 3 Drawing Sheets

POWER DISTRIBUTION PLANE LAYOUT FOR VLSI PACKAGES

FIELD OF THE INVENTION

The present invention relates, in general to power interconnections inside microprocessor packages and other very large scale integrations and more particularly to use of power and ground distribution planes.

BACKGROUND OF THE INVENTION

Deep sub-micron dimensions, multi-gigahertz clock frequencies, and transistor counts in the tens of millions are becoming commonplace in today's microprocessors and other very large scale integrations (VLSI's). Historically, the dominant performance-limiting characteristic associated with VLSI circuits was transistor switching speed. Now, however, a host of new design issues have emerged, among them, the need for clean power and ground distribution to switching devices. Impedances in the power and ground distribution networks, and crosstalk between neighboring paths in the networks are key issues that can lead to system instability and limit overall performance of a processor or other VLSI design. Therefore, in order to further increase VLSI performance, classical power and ground distribution networks may not be suitable.

Traditional high performance power and ground distribution networks can be divided into two types. The first type consists of power and ground grids, where a number of equal-width tracks form finely meshed orthogonal grids on all layers of a multi-layer VLSI package. There are usually grids for power (Vdd) and ground (Grd). While a power and ground grid configuration provides relatively simple design and other beneficial characteristics, it suffers from the key disadvantage of consuming a significant portion of the available space on the chip. In today's processors it is not uncommon to use 25% to 40% of all usable interconnect space (also termed routing space) for power and ground distribution grids.

The second type of power and ground distribution network consists of separate distribution planes. In this configuration, two entire layers of the multi-layer VLSI package are dedicated to power distribution. Typically one layer is used for Vdd and one for ground. The two distribution planes can be separated by one or more layers of signal nets, and are often bordered above and below by additional layers of signal nets or insulating substrates. Power distribution planes have clear advantages over power grids in that they reduce inductance by providing shorter and more direct current paths. Thus, many advanced high-power processors and VLSI devices favor planar designs The prior art power distribution planes are generally interspersed with a regular pattern of insulating regions. FIG. 1 depicts such a conventional power distribution plane 100 with conductive paths 120 and insulating regions 140. In the traditional art, the insulating regions are created in square or rectangular shapes for ease of manufacture.

Insulating regions serve two primary purposes. First, they allow construction of limited-width conductive paths. Due to aspects of the manufacturing process, it is easier to construct conductors of a limited width than a solid plane. Thus, a matrix pattern is favored. Secondly, the insulating regions provide a convenient area to locate pass-through vias, pathways that connect the signal nets above the plane to the signal nets below the plane. These vias take up a significant portion of the power distribution plane area since there is often need for a large number of interconnections. The insulating regions conveniently accommodate these vias, avoiding the need to intersperse them throughout the conductive regions.

Despite their improvement over grids, classical plane layouts with rectangular insulating regions still have key shortcomings. It would be desirable to decrease the impedance of the current paths. High path impedance promotes crosstalk between switching devices driven by the power distribution plane. In a typical crosstalk situation, a change in a first switching device may be reflected as a bounce or delay in other switching devices. This occurs when current flowing to or from a first switching device in the distribution plane shares a section of conductive path with current flowing to or from other devices. The higher the impedance along such a shared path the more electromagnetic (inductive) coupling between the current flows. When the first switching device changes state a fluctuation is thus induced in the current supplied to the other switching is devices.

Typically, a VLSI device is designed to expect, and tolerate, voltage fluctuations of about 5% to 10%. However, if the voltage exceeds this tolerance, speed-critical devices will be slowed. It is possible that the device will perform properly in most operations, but fail under certain execution sequences, since the coupling depends on which switching devices are being activated, which in turn depends on the currently executed instructions.

High impedance can be caused by a special phenomenon related to orthogonal corners and boundaries. This phenomenon causes higher impedance when current flows around right-angle corners than around lesser exterior angle corners. Electromagnetic fields become concentrated at sharp bends in a current path, such as the bend made by a ninety degree corner. In such a bend, more electromagnetic flux lines intersect the path of the current flow along a straight portion of conductive path, increasing the local impedance. Therefore it would be highly desirable to minimize the use of ninety-degree corners in a distribution plane design.

SUMMARY OF THE INVENTION

The present invention comprises a layout for power and ground planes that can be employed in multi-layer VLSI packages. The power and ground planes are constructed as a matrix of conductive paths surrounding hexagonal or similarly shaped insulating regions.

The use of a hexagonal pattern mitigates crosstalk in signal nets generated by coupling in the power and/or ground distribution planes. With a hexagonal plane pattern for example, there is an increased probability that a low impedance direct line current path, one without corners, will be available to a current flow. While prior art orthogonal designs provided only four primary directions of conductor paths, the hexagonal configuration increases this number to six. Secondly, the largest exterior angle current must deflect around in a hexagonal configuration is sixty degrees, as opposed to ninety degrees in the prior art. This advantageously avoids increased impedance at right-angle corners, a phenomenon caused by electromagnetic field concentrations caused by right angles and other sharp bends in a conductor path.

BRIEF DESCRIPTION OF THE DRAWINGS

The invention description below refers to the accompanying drawings, of which.

DETAILED DESCRIPTION OF AN ILLUSTRATIVE EMBODIMENT

While the following illustrative embodiment specifically refers to a power distribution plane, it should be remembered that the teachings of this invention can be applied to ground distribution planes with similar advantage. In the following illustrative embodiment, one can substitute reference to the power distribution plane with reference to a ground distribution plane without modifying surrounding structures or configurations.

Figure 2:
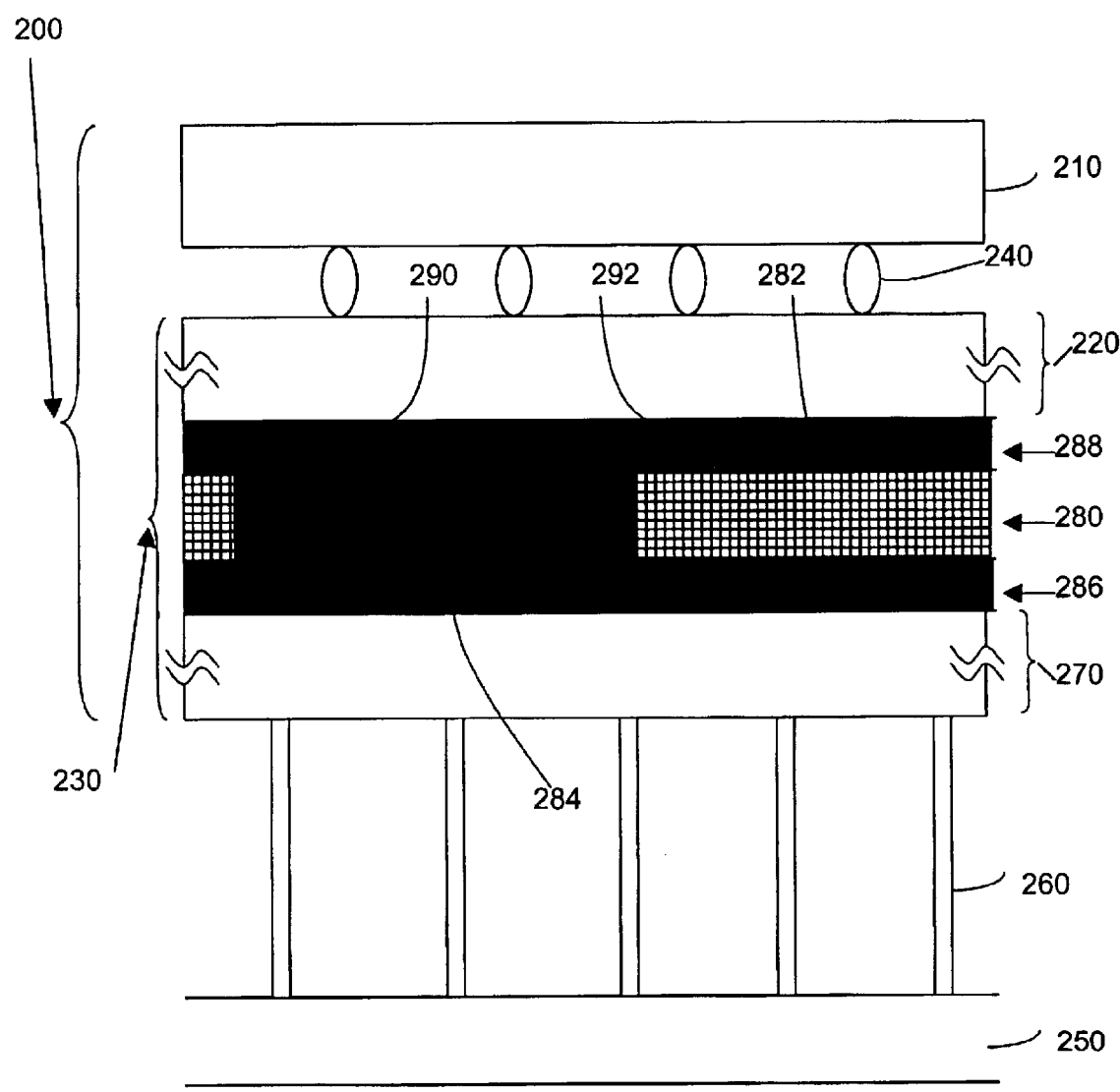
FIG. 2 is a simplified cross-sectional view of a VLSI chip package, shown mounted on a printed circuit board.

As shown in FIG. 2, a VLSI package 200 includes a chip 210 mounted on a signal net layer 220 of an underlying substrate 230 with solder bumps 240 that bond the chip to the layer 220 and also provide electrical connection to the substrate 230. The package 200 is connected to a printed circuit board (PCB) 250 by pins 260 extending from a second signal net layer 270. An intermediate layer is a power distribution plane 280 comprising alternating conductive paths 282 and insulating regions 284. The power distribution plane 280 is sandwiched between insulating layers 286 and 288, which insulate the conductive paths 282 from adjacent layers of the VLSI substrate 230. A first via 290 connects two layers through an insulating region 284 of the power distribution plane 280. A second via 292 connects the conductive paths 282 to another layer of the substrate 230.

FIG. 2 is a greatly simplified view of a VLSI package. Ordinarily, the package will contain additional power distribution layers and signal net layers.

Figure 1:
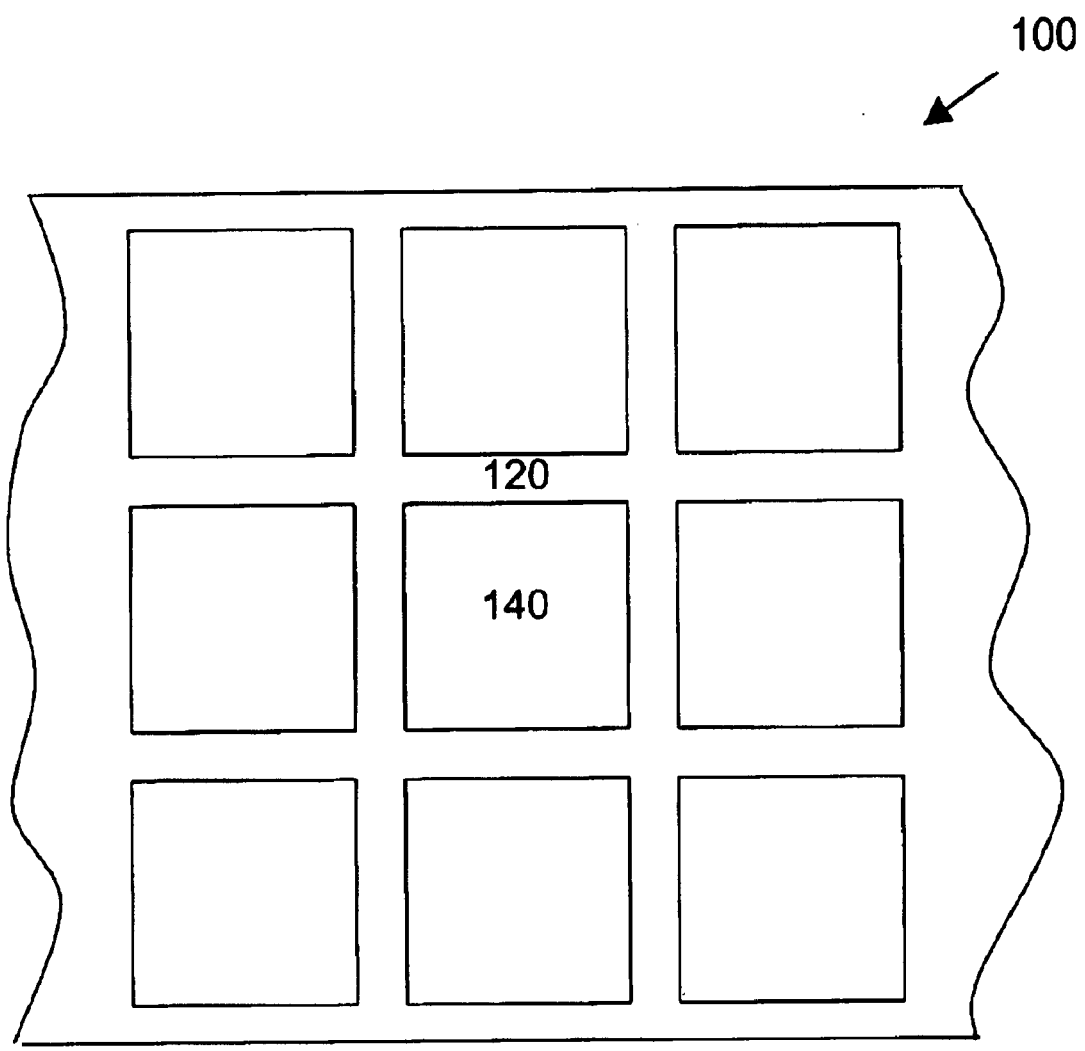
FIG. 1 is; a schematic overhead view of a prior art power distribution plane, the plane having a rectangular pattern of insulating regions surrounded by conductive paths.
Figure 3:
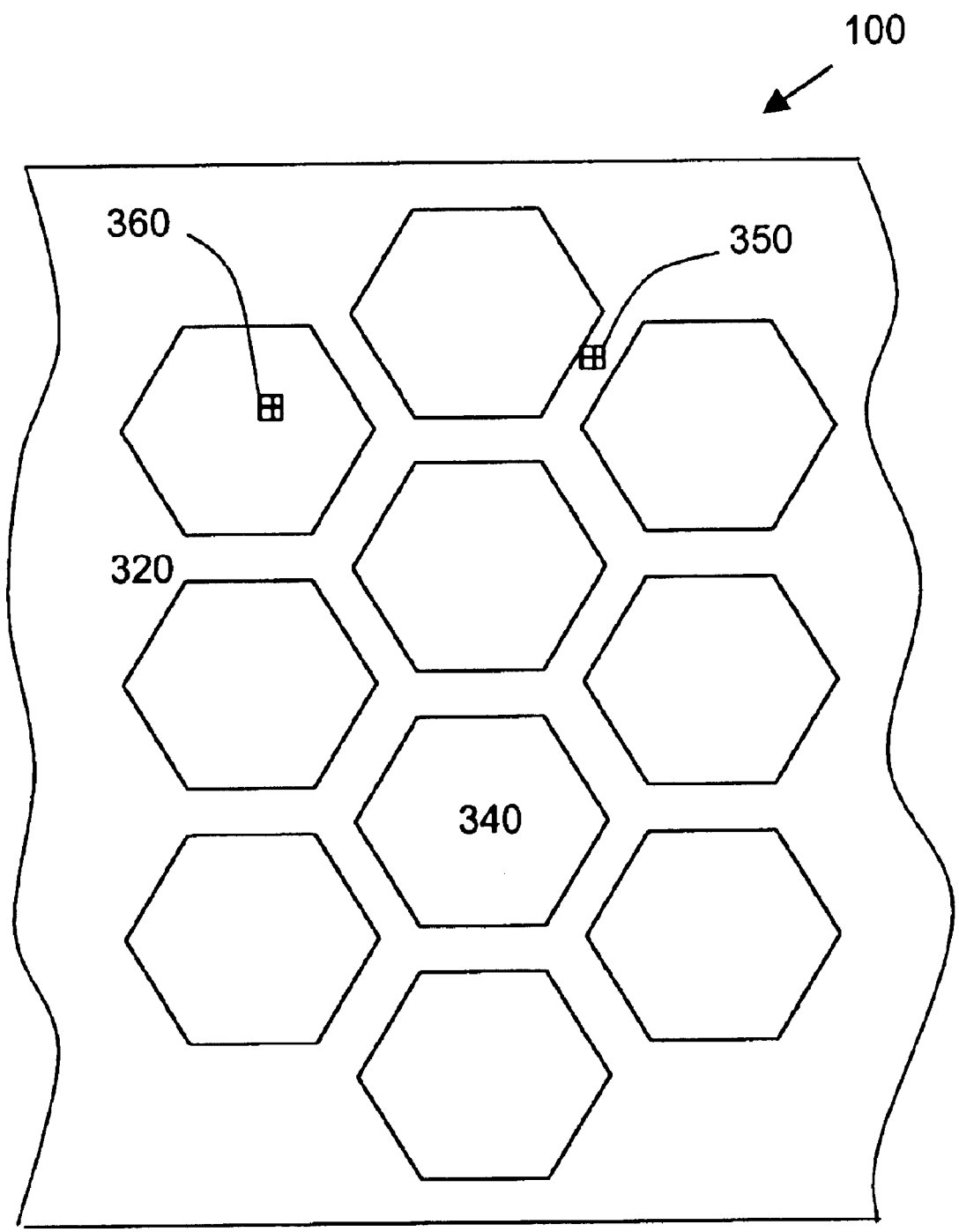
FIG. 3 is a schematic overhead view of an improved power distribution plane included in the VLSI package of FIG. 2.

FIG. 3 is a plan view of the power distribution plane 280. The conductive paths 282 surround a pattern of hexagonal insulating regions 284. This configuration reduces impedance and thus coupling among current flows, as compared to prior art FIG. 1, by providing current paths that are more direct. Specifically, there are more corners on each insulating region 284, each corner having smaller exterior angles than the rectangles in the prior art. Thus, in order to pass around the insulating regions, the current has to deflect only a maximum of 60 degrees as compared to a maximum of 90 degrees when the insulating regions are rectangular. Thus in FIG. 3, there are six primary directions of conductor paths as opposed to only four directions in the prior art. Current flow thus more closely follows a straight-line path, consequently lowering path impedance.

The foregoing description has been directed to specific embodiments of this invention. It will be apparent, however, that other variations and modifications may be made to the described embodiments with the attainment of some or all of their advantages. For example, matrices of geometric shapes other than hexagonal may be advantageously employed in the distribution planes. Such matrix designs should provide for an increased number of current path directions and a reduction in the number angles of ninety degrees or greater. Therefore, it is the object of the appended claims to cover all such matrix configurations as well as any other such variation and modifications as come within the true spirit and scope of this invention.

What is claimed is:

1. A method for distributing current in a multi-layer integrated circuit device comprising the steps of:

providing a distribution plane as a layer of the multi-layer device, the distribution plane having a repeating pattern of geometrically shaped insulating regions surrounded by a matrix of conductive paths, the insulating regions having a majority of exterior angles substantially less than ninety degrees, the conductive paths providing a pathway for current flow between the insulating regions;

operatively connecting the distribution plane at one or more points to a current source; and operatively connecting the distribution plane at one or more points a current drain.

2. The method of claim 1, wherein the distribution plane provides more than four primary directions of conductive paths.

3. The method of claim 1, wherein the distribution plane is a power distribution plane that provides Vdd to operatively connected signal nets.

4. The method of claim 1, wherein the distribution plane is a ground plane and provides ground to operatively connected signal nets.

5. The method of claim 1, wherein the distribution plane is operatively connected to a number of vias, the vias operatively connecting the distribution plane with one or more additional layers of the multi-layer integrated circuit, the layers separated by one or more insulating films.

6. A system for distributing current in a multi-layer integrated circuit device comprising:

a distribution plane, the distribution plane having a repeating pattern of geometrically shaped insulating regions surrounded by a matrix of conductive paths, the insulating regions having a majority of exterior angles substantially less than ninety degrees, the conductive paths providing a pathway for current flow between the insulating regions;

a first set of one or more operative connections between the distribution plane and a current source; and a second set of one or more operative connections between the distribution plane and a current drain.

7. The system of claim 6, wherein the distribution plane provides more than four primary directions of conductive paths.

8. The system of claim 6, wherein the distribution plane is a power distribution plane that provides Vdd to operatively connected signal nets.

9. The system of claim 6, wherein the distribution plane is a ground distribution plane and provides ground to operatively connected signal nets.

10. The system of claim 6, wherein the distribution plane is operatively connected to a number of vias, the vias operatively connecting the distribution plane with one or more additional layers of the multi-layer integrated circuit, the layers separated by one or more insulating films.

* * * * *